(12) United States Patent
Parker

(10) Patent No.: US 7,928,404 B2
(45) Date of Patent: Apr. 19, 2011

(54) VARIABLE-RATIO DOUBLE-DEFLECTION BEAM BLANKER

(75) Inventor: N. William Parker, Pleasanton, CA (US)

(73) Assignee: Multibeam Corporation, Santa Clara, CA (US)

( * ) Notice: Subject to any disclaimer, the term of this patent is extended or adjusted under 35 U.S.C. 154(b) by 121 days.

(21) Appl. No.: 12/120,174

(22) Filed: May 13, 2008

(65) Prior Publication Data
US 2009/0206272 A1 Aug. 20, 2009

Related U.S. Application Data

(63) Continuation-in-part of application No. 11/225,376, filed on Sep. 12, 2005, now Pat. No. 7,435,956, which is a continuation-in-part of application No. 11/093,000, filed on Mar. 28, 2005, now Pat. No. 7,227,142, which is a continuation-in-part of application No. 10/962,049, filed on Oct. 7, 2004, now Pat. No. 7,462,848.

(60) Provisional application No. 60/930,420, filed on May 15, 2007, provisional application No. 60/608,609, filed on Sep. 10, 2004, provisional application No. 60/509,582, filed on Oct. 7, 2003, provisional application No. 60/582,014, filed on Jun. 21, 2004.

(51) Int. Cl.
*H01J 37/28* (2006.01)
(52) U.S. Cl. ............... 250/396 R; 250/398; 250/492.23
(58) Field of Classification Search ............. 250/396 R, 250/310, 492.22, 492.23, 492.2, 398
See application file for complete search history.

(56) References Cited

U.S. PATENT DOCUMENTS

| 4,243,866 A | | 1/1981 | Pfeiffer et al. |
| 4,342,949 A | | 8/1982 | Harte et al. |
| 4,514,638 A | | 4/1985 | Lischke et al. |
| 4,634,871 A | * | 1/1987 | Knauer ................ 250/398 |
| 4,742,234 A | | 5/1988 | Feldman et al. |
| 4,788,431 A | | 11/1988 | Eckes et al. |
| 4,902,898 A | | 2/1990 | Jones et al. |
| 5,276,330 A | | 1/1994 | Gesley |
| 5,371,774 A | | 12/1994 | Cerrina et al. |
| 5,430,292 A | | 7/1995 | Honjo et al. |
| 5,455,427 A | | 10/1995 | Lepselter et al. |
| 5,466,940 A | | 11/1995 | Litman et al. |
| 5,608,218 A | | 3/1997 | Sato et al. |
| 5,644,132 A | | 7/1997 | Litman et al. |
| 5,756,237 A | | 5/1998 | Amemiya |
| 5,817,442 A | | 10/1998 | Okino |

(Continued)

*Primary Examiner* — Kiet T Nguyen

(57) ABSTRACT

The invention provides methods for conjugate blanking of a charged particle beam within a charged particle column using a beam blanker. The beam blanker comprises a first deflector, a second deflector and a blanking aperture, the first deflector being positioned between a gun lens and a main lens, the second deflector being positioned between the first deflector and the main lens, the blanking aperture being positioned between the second deflector and the main lens, and the first deflector, the second deflector and the blanking aperture being aligned on the optical axis of the column. A method according to the invention comprises the steps of: configuring electron optical elements of said charged particle column to form a beam in the column either with or without a crossover; configuring the main lens to focus the beam formed by the gun lens onto a substrate plane; deflecting the beam with a first deflector in a first direction; and deflecting the beam with a second deflector in a second direction onto the blanking aperture, wherein the first direction is parallel or anti-parallel to the second direction; and wherein the image at the substrate plane does not move during blanking.

14 Claims, 11 Drawing Sheets

U.S. PATENT DOCUMENTS

| | | | |
|---|---|---|---|
| 5,847,959 | A | 12/1998 | Veneklasen et al. |
| 5,900,667 | A | 5/1999 | Veneklasen et al. |
| 5,981,947 | A | 11/1999 | Nakasuji et al. |
| 5,981,962 | A | 11/1999 | Groves et al. |
| 5,982,190 | A | 11/1999 | Toro-Lira |
| 6,075,245 | A | 6/2000 | Toro-Lira |
| 6,355,994 | B1 | 3/2002 | Andeen et al. |
| 6,466,301 | B1 | 10/2002 | Yui et al. |
| 6,556,702 | B1 | 4/2003 | Rishton et al. |
| 6,614,035 | B2 | 9/2003 | Hartley |
| 6,617,587 | B2 | 9/2003 | Parker et al. |
| 6,635,402 | B2 | 10/2003 | Yahiro |
| 6,734,428 | B2 | 5/2004 | Parker et al. |
| 6,777,675 | B2 | 8/2004 | Parker et al. |
| 6,797,953 | B2 | 9/2004 | Gerlach et al. |
| 6,844,550 | B1 | 1/2005 | Yin et al. |
| 6,872,958 | B2 | 3/2005 | Andeen et al. |
| 6,878,936 | B2 | 4/2005 | Kienzle et al. |
| 6,903,345 | B2 | 6/2005 | Ono et al. |
| 6,943,351 | B2 | 9/2005 | Parker |
| 6,977,375 | B2 | 12/2005 | Yin et al. |
| 7,084,414 | B2 | 8/2006 | Wieland et al. |
| 7,122,795 | B2 | 10/2006 | Parker et al. |
| 2002/0127050 | A1 | 9/2002 | Andeen et al. |
| 2003/0066963 | A1 | 4/2003 | Parker et al. |
| 2005/0001165 | A1 | 1/2005 | Parker et al. |

* cited by examiner

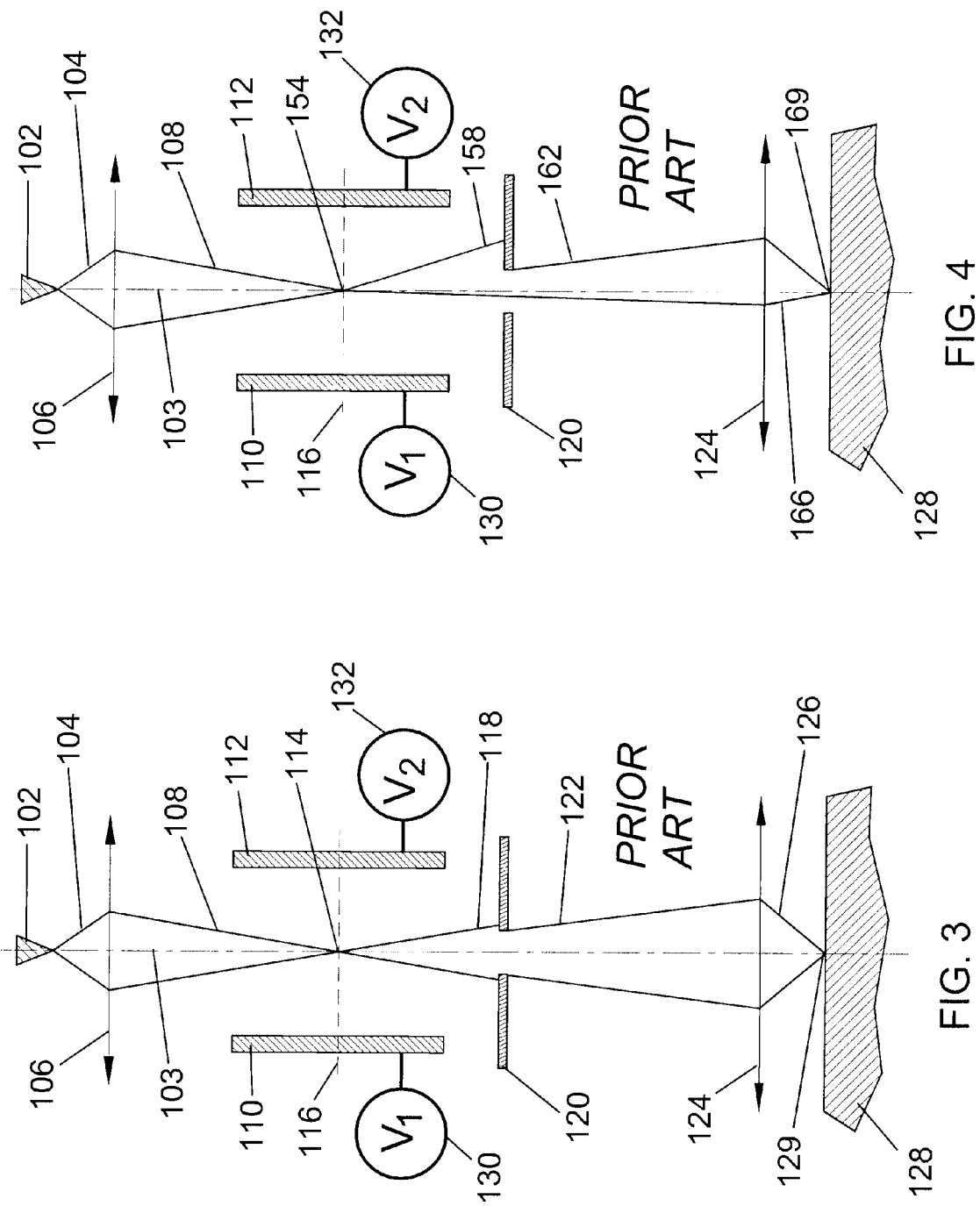

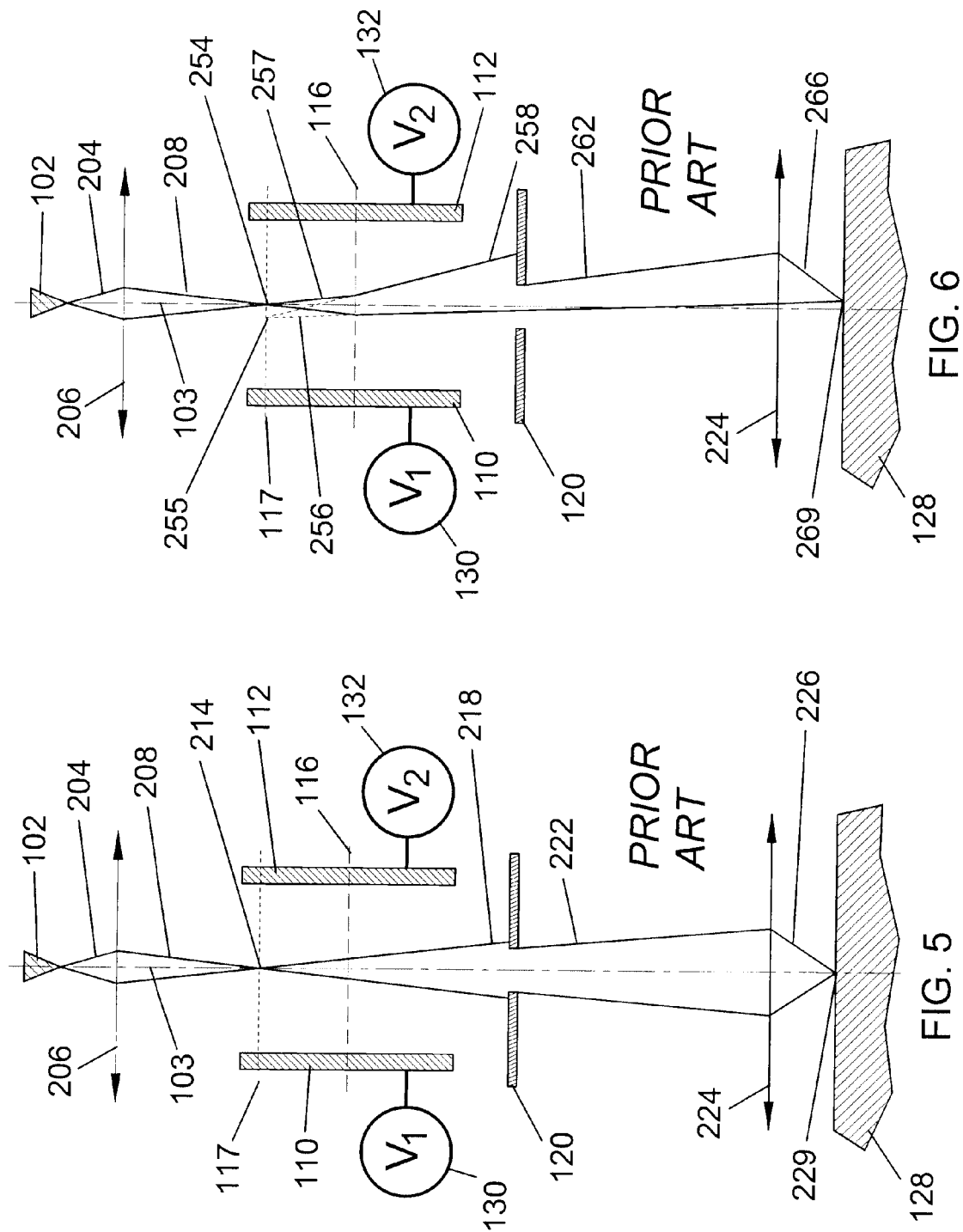

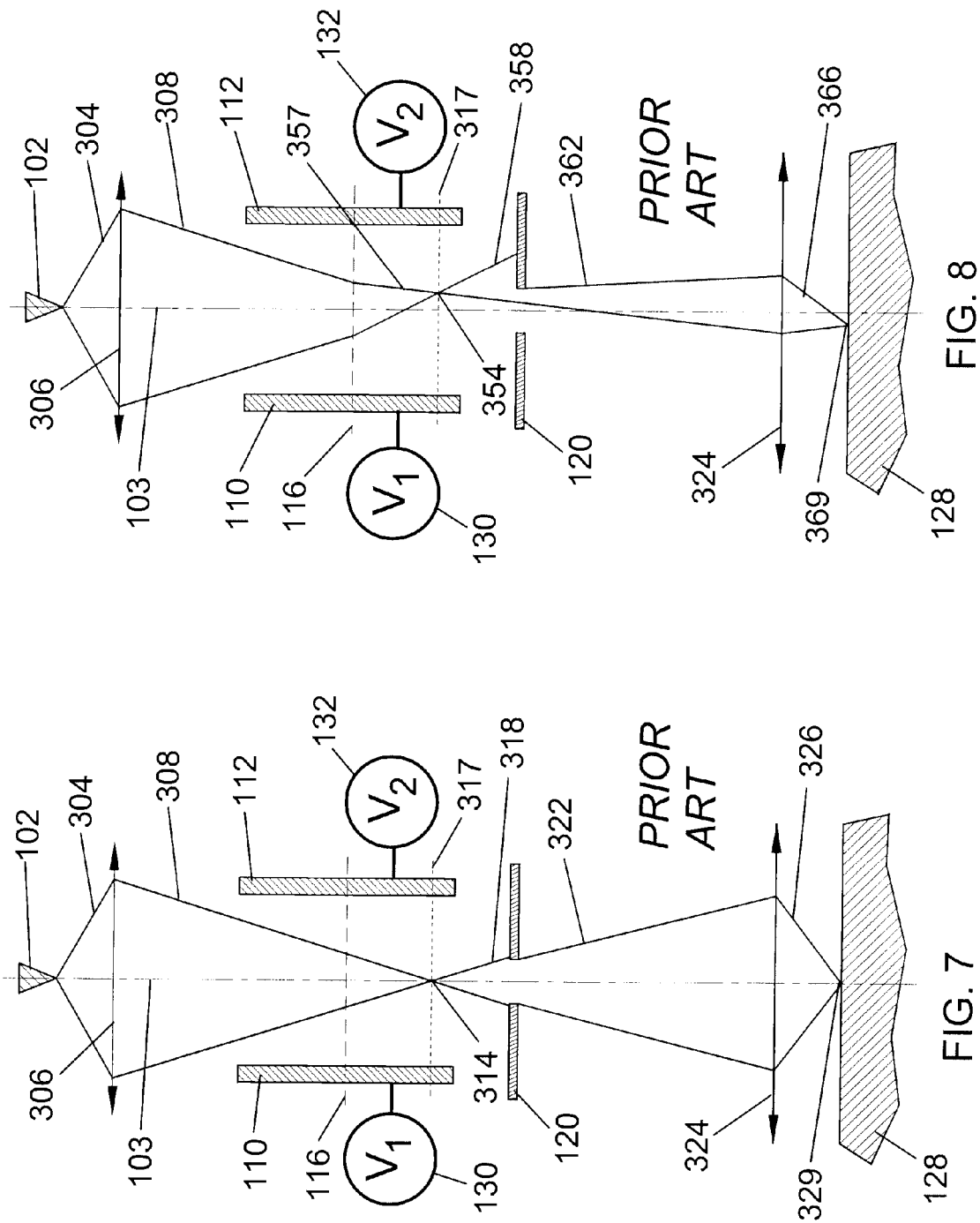

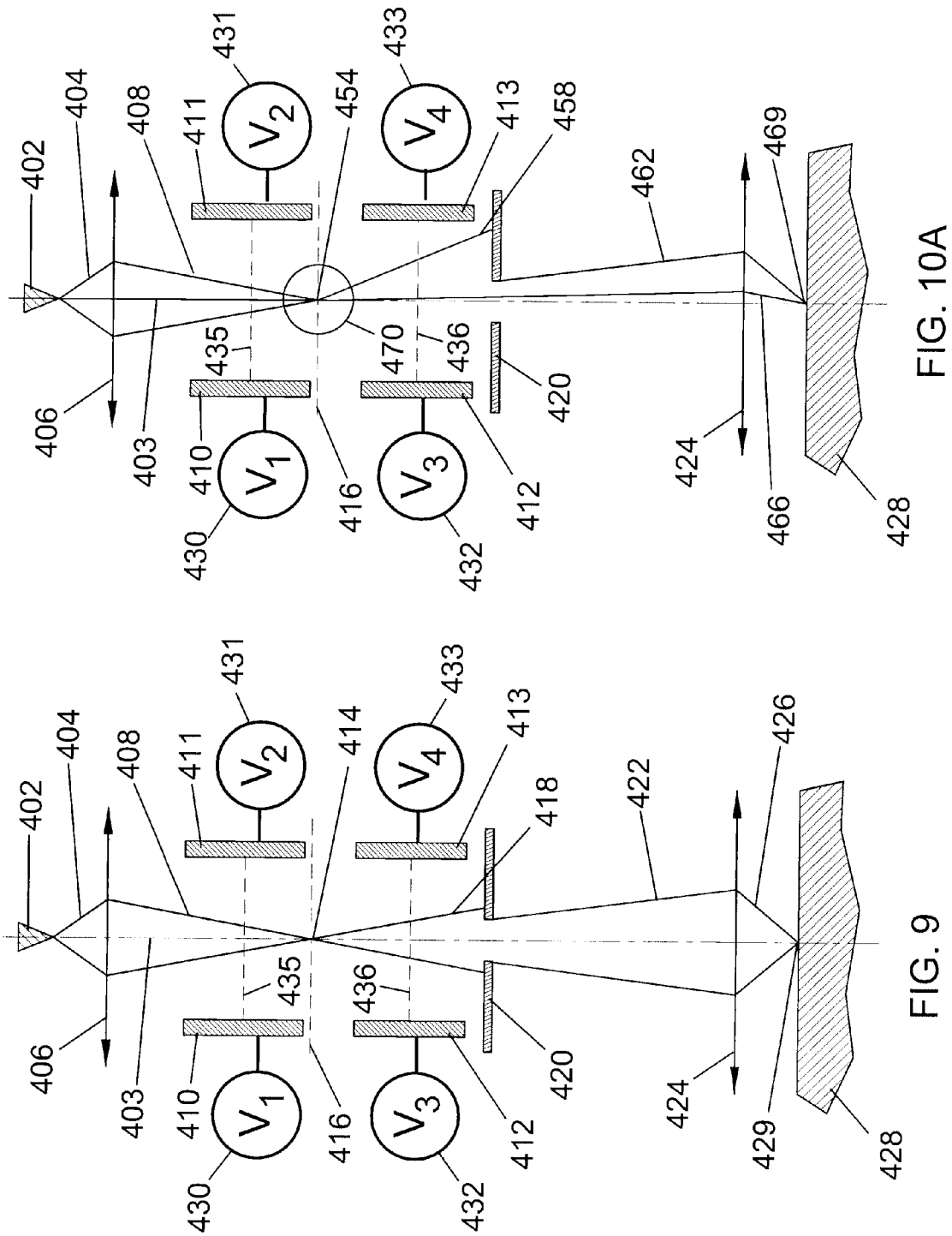

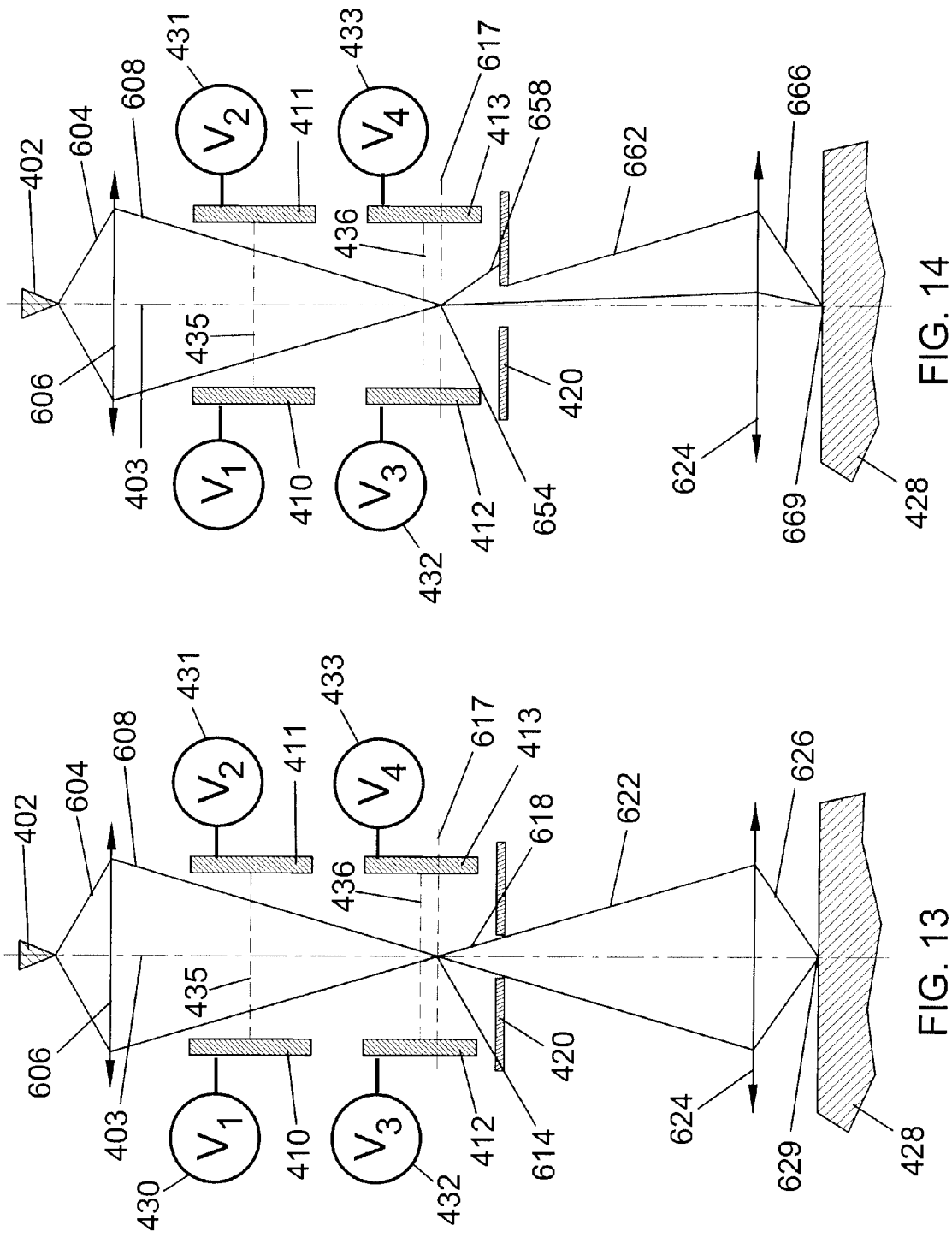

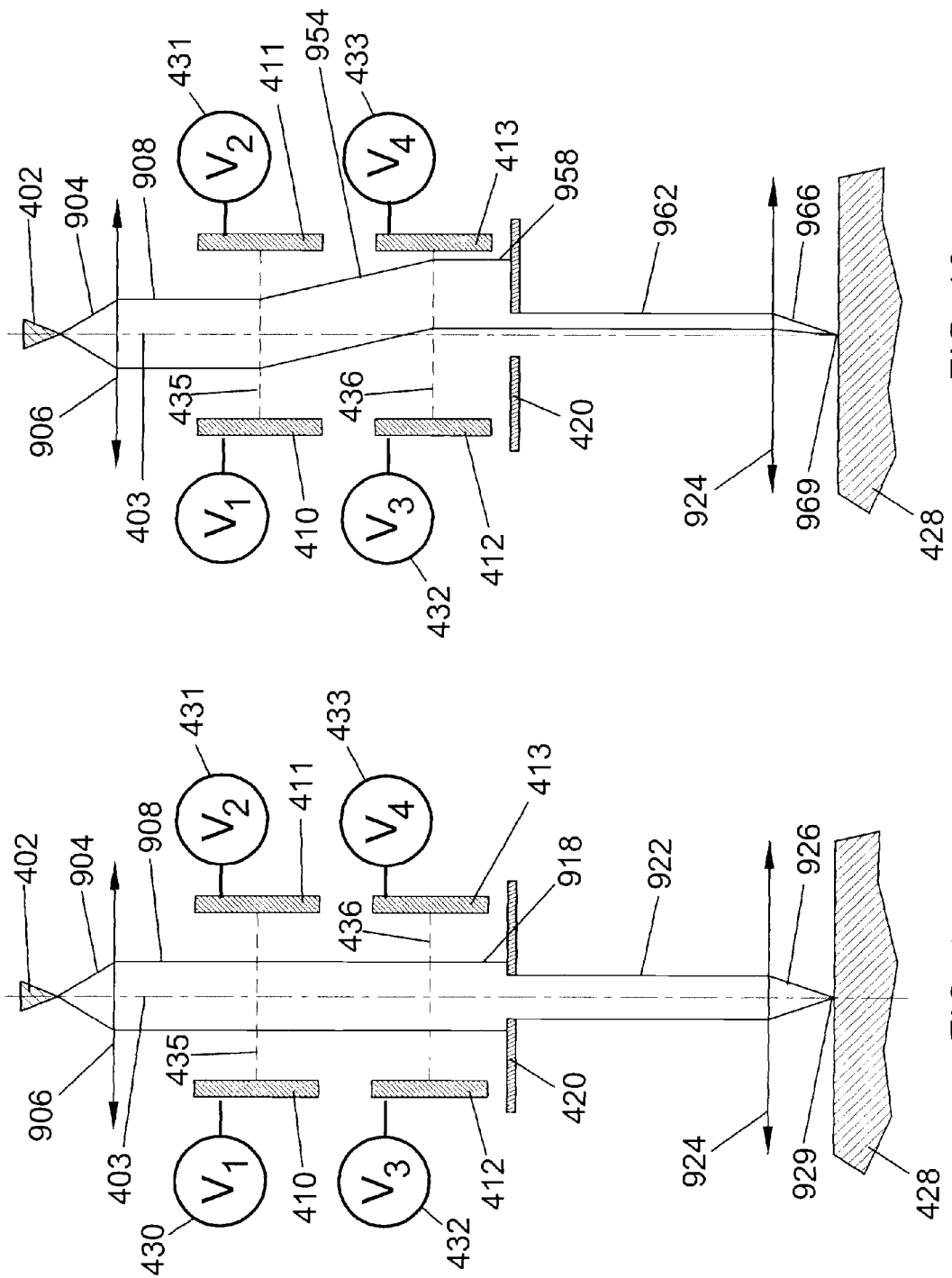

US 7,928,404 B2

VARIABLE-RATIO DOUBLE-DEFLECTION BEAM BLANKER

CROSS-REFERENCE TO RELATED APPLICATIONS

This application claims the benefit of U.S. Provisional Application Ser. No. 60/930,420, filed May 15, 2007 and is (a) a Continuation-in-Part of U.S. application Ser. No. 11/225,376, filed Sep. 12, 2005 now U.S. Pat. No. 7,435,956 (which claims the benefit of U.S. Provisional Application Ser. No. 60/608,609, filed Sep. 10, 2004), which is a Continuation-in-Part of U.S. application Ser. No. 11/093,000, filed Mar. 28, 2005 (which claims the benefit of U.S. Provisional Application Ser. No. 60/608,609, filed Sep. 10, 2004), now U.S. Pat. No. 7,227,142, and (b) a Continuation-in-Part of U.S. application Ser. No. 10/962,049, filed Oct. 7, 2004 now U.S. Pat. No. 7,462,848 (which claims the benefit of U.S. Provisional Application Ser. No. 60/509,582, filed Oct. 7, 2003 and U.S. Provisional Application Ser. No. 60/582,014, filed Jun. 21, 2004), all of which are expressly incorporated by reference herein.

BACKGROUND OF THE INVENTION

1. Field of the Invention

This invention relates generally to the field of charged particle optical columns, and more particularly to methods and apparatus for charged particle beam blanking.

2. Description of the Related Art

The use of electron beams is an established technique used to write on a resist on the surface of a substrate to be patterned. Applications of electron-beam lithography include writing of masks and reticles for use in semiconductor photolithography, and electron-beam direct-write (EBDW) on semiconductor wafers. In these applications, in order to write a pattern, it is necessary to be able to turn the beam on and off at the substrate in a rapid and controlled manner. To do this, a device called a "beam blanker" is commonly employed, as is familiar to those skilled in the art. A beam blanker is typically a pair of flat electrodes, one located on each side of the beam in an electron optical column. FIGS. 1 and 2 illustrate two embodiments of a prior art beam blanker.

Beam Blanking by a Single Pair of Blanker Plates

FIG. 1 is a schematic side cross-sectional view of a first prior art beam blanker deflecting a charged particle beam. A converging electron beam 702 moves downwards (arrow 703) towards a pair of blanker plates 706 and 708, located symmetrically on each side of optical axis 704. Blanker plates 706 and 708 have flat inner surfaces extending above and below the plane of the figure. Voltage supply $V_1$ 736 is connected to plate 706, while voltage supply $V_2$ 738 is connected to plate 708. In FIG. 1, $V_1<0$ and $V_2=-V_1>0$, thus a horizontal electric field is induced between plates 706 and 708 which deflects the electron beam 702 to the right as shown. Ignoring end effects at the tops and bottoms of plates 706 and 708, the beam is deflected smoothly as shown in FIG. 1, passing through a crossover 716, then diverging as beam 712 passes out from the space between blanker plates 706 and 708. Deflection angle 724 shows the angle between the incoming beam 702 and the outgoing beam 712, which is centered on axis 714 with direction 713. Although the actual beam deflection due to the pair of blanker plates 706 and 708 is a smooth curve, the overall beam deflection 724 can be approximated by an step-function change in beam direction centered in plane 710 (the mid-plane of plates 706 and 708), with the same deflection angle 724 as is shown for the actual beam trajectory through the blanker. Plane 710 is commonly called the "effective blanking plane". In this approximation, beam 702 is extrapolated between the tops of plates 706 and 708 down to plane 710 by virtual trajectories 718, which converge to a virtual crossover 720. Below the virtual crossover 720, virtual trajectories 722 extend to the bottom of plates 706 and 708, asymptotically converging to the actual beam profile 712. This approximation is used throughout FIGS. 3-10A, 11, 12A, 13, and 14A for simplicity of illustration of both the prior art and the present invention.

Beam Blanking by a Double Pair of Blanker Plates

FIG. 2 is a schematic side cross-sectional view of a second prior art beam blanker deflecting a charged particle beam, comprising two pairs of blanker electrodes. One pair (electrodes 806 and 808) is positioned above the effective blanking plane 810 and the other pair (electrodes 826 and 828) is positioned below the effective blanking plane 810. With this alternative configuration, there is the capability to position a blanking aperture in the effective blanking plane, shown as two plates 841 and 842. Alternatively, the blanking aperture may be a single plate with a hole on optical axis 804.

A converging electron beam 802 moves downwards (arrow 803) into the gap between a first pair of blanker plates 806 and 808, located symmetrically on each side of optical axis 804. Blanker plates 806 and 808 have flat inner surfaces extending above and below the plane of the figure. A second pair of blanker plates 826 and 828 is positioned below the first pair as shown. The effective blanking plane 810 is located between the first pair and the second pair of blanker electrodes. Upper plates 806 and 808 deflect the beam off-axis and onto either plate 841 or plate 842, thereby blanking the beam (FIG. 2 shows beam 802 with almost enough deflection to hit plate 842). Lower plates 826 and 828 enable conjugate blanking by maintaining the virtual crossover 820 on-axis, even while the actual crossover 816 is moving off-axis due to the beam deflection induced by plates 806 and 808. Voltage supply $V_1$ 836 is connected to plates 806 and 826, while voltage supply $V_2$ 838 is connected to plates 808 and 828. In FIG. 2, $V_1<0$ and $V_2=-V_1>0$, thus two horizontal electric fields are induced: a first field between plates 806 and 808, and a second field between plates 826 and 828. The combined effect of the two electric fields is equivalent to the effect of the electric field between plates 706 and 708 in FIG. 1. The combined influence of the two electric fields deflects the electron beam 802 to the right as shown. Ignoring end effects at the tops and bottoms of plates 806, 808, 826, and 828, the beam is deflected smoothly as shown in FIG. 2, passing to a crossover 816, then diverging as beam 812 passes out from the space between blanker plates 826 and 828. Deflection angle 824 shows the angle between the incoming beam 802 and the outgoing beam 812, which is centered on axis 814 with direction 813. Although the actual beam deflection due to the two pairs of blanker plates is a smooth curve, the overall beam deflection 824 can be approximated by an step-function change in beam direction centered in plane 810, as for plane 710 in FIG. 1. Because plates 806 and 828 are connected to the same voltage supply 836, and plates 808 and 828 are connected to the same voltage supply 838, the position of the effective blanking plane is fixed in this prior art embodiment.

The Need for Conjugate Blanking in an Electron-Beam Lithography System

FIG. 3 is a schematic side cross-sectional view of a prior art electron beam column showing an unblanked beam with a crossover at the center of a single pair of blanker plates. Electrons are shown being emitted from a source tip 102 at the top of the column to form a diverging beam 104. The electron source can be a cold field emitter, a Schottky thermal field emitter, a LaB$_6$ thermal emitter, a thermionic source, or any other type of electron emitter—the particular type of electron source is not part of the present invention. Beam 104 is focused into a converging beam 108 by lens 106, commonly called a "gun lens". Source 102, lens 106, blanking aperture 120, and lens 124 are all centered on symmetry axis 103. Lens 106 forms a crossover 114 on axis 103 at the effective blanking plane 116 of the blanker comprising plates 110 and 112, which extend above and below the planes of FIGS. 3-8. Voltage supply V$_1$ 130 is connected to plate 110, while voltage supply V$_2$ 132 is connected to plate 112. In FIG. 3, V$_1$=V$_2$=0 (i.e., the blanker is not activated), thus there is no electric field induced between plates 110 and 112 and beam 108 above crossover 114, and beam 118 below crossover 114, are not deflected off axis 103. Because the diverging beam 118 is undeflected by the blanker, a portion of the electrons in beam 118 passes through aperture 120, to form diverging beam 122. Beam 122 is then focused into a converging beam 126 by lens 124, commonly called the "objective lens", or "main lens". Beam 126 is focused onto the surface of substrate 128 at image 129 by lens 124. The beam at image 129 is a focused image of the virtual object at the beam crossover 114. The overall magnification of the electron source 102 at the image 129 is determined by the position of crossover 114 in relation to source 102, lenses 106 and 124, and the substrate 128, as is familiar to those skilled in the art.

FIG. 4 is a schematic side cross-sectional view of a prior art electron beam column showing a partially blanked beam with a crossover at the center of a single pair of blanker plates. As in FIG. 3, electrons from source 102 form a diverging beam 104 which is focused into a converging beam 108 by lens 106. Lens 106 forms a crossover 154 on axis 103 at the mid-plane 116 of the pair of blanker plates 110 and 112. In FIG. 4, V$_1$<0 and V$_2$=−V$_1$>0, thus a horizontal electric field is induced between plates 110 and 112 which deflects the electron beam 158 to the right as shown. Note that the approximation of a step-function beam deflection illustrated in FIG. 1 is used here—the curvature of the actual electron trajectories while passing between plates 110 and 112 is not shown. Beam 158 represents a partially-blanked beam in the column since fewer electrons in beam 158 pass through aperture 120 than in beam 118 in FIG. 3. Those electrons that do pass through aperture 120 form diverging beam 162, which is focused into converging beam 166 by lens 124. Beam 166 is focused onto the surface of substrate 128 at image 169 by lens 124. The beam at image 169 is a focused image of the virtual object at the beam crossover 154. Because the blanker effectively "pivots" the beam at the crossover 154, image 169 is on axis 103—this is called "conjugate blanking", as is familiar to those skilled in the art. The importance of conjugate blanking for an electron beam lithography system is that as the beam is blanked on and off, the location of the focused image on the substrate surface (such as image 129 in FIG. 3, and image 169 in FIG. 4) does not move. If the focused image were to move during beam blanking or unblanking, then the pattern written on the substrate would be blurred, which is clearly undesirable for precision patterning. Thus, FIGS. 3 and 4 illustrate the ideal case where the beam crossover is at the effective blanking plane and thus conjugate blanking is ensured.

In order to ensure conjugate blanking in the column illustrated in FIGS. 3 and 4, it is clearly necessary to maintain the beam crossovers 114 and 154 at the effective blanking plane 116—this means that the overall magnification from the source 102 to the images 129 and 169 must remain fixed, since the only means for changing the magnification is by moving the position of the crossover. For example, to reduce the magnification, the crossover would be moved up, as in FIGS. 5 and 6, while to increase the magnification, the crossover would be moved down, as in FIGS. 7 and 8. The problem with the prior art blanker can now be seen—if it is necessary to change the column magnification, a simple two-plate blanker as shown in FIGS. 3-8 cannot preserve conjugate blanking. This is discussed in more detail for FIGS. 5-8.

Non-Conjugate Blanking—Crossover Above the Effective Blanking Plane

FIG. 5 is a schematic side cross-sectional view of a prior art electron beam column showing an unblanked beam with a crossover above the center of a single pair of blanker plates, corresponding to a situation in which the magnification of the source at the substrate is smaller than in FIGS. 3 and 4. Electrons are shown being emitted from a source tip 102 at the top of the column to form a diverging beam 204. Beam 204 is focused into a converging beam 208 by lens 206. Lens 206 is physically equivalent to lens 106 in FIGS. 3 and 4, however the focusing strength of lens 206 has been increased relative to lens 106 to move crossover 214 higher in the column (along axis 103) than crossovers 114 and 154 in FIGS. 3 and 4, respectively. Since the position of the effective blanking plane 116 is unchanged, crossover 214 (in plane 117) is now no longer at the position required to produce conjugate blanking. In FIG. 5, V$_1$=V$_2$=0 (i.e., the blanker is not activated), thus there is no electric field induced between plates 110 and 112 and beam 208 above crossover 214, and beam 218 below crossover 214, are not deflected off axis 103. Because the diverging beam 218 is undeflected by the blanker, a portion of the electrons in beam 218 passes through aperture 120, to form diverging beam 222. Beam 222 is then focused into a converging beam 226 by lens 224. Lens 224 is physically equivalent to lens 124 in FIGS. 3 and 4, however the focusing strength of lens 224 has been decreased relative to lens 124 to compensate for the higher position of crossover 214, which is the virtual object for lens 224. Control of the focusing strengths of lenses 206 and 224 may be accomplished by changing the excitation current (for magnetic lenses), or by changing the voltages of one or more electrodes (for electrostatic lenses). Beam 226 is focused onto the surface of substrate 128 at image 229 by lens 224. Because in FIG. 5 the blanker comprising plates 110 and 112 is not activated, image 229 still falls on axis 103.

FIG. 6 is a schematic side cross-sectional view of a prior art electron beam column showing a partially blanked beam with a crossover above the center of a single pair of blanker plates. As in FIG. 5, electrons from source 102 form a diverging beam 204 which is focused into a converging beam 208 by lens 206. Lens 206 forms a crossover 254 in plane 117, which is above the effective blanking plane 116, as in FIG. 5. Beam 257 below crossover 254 is a diverging beam which can be treated as having a step-function deflection at the effective blanking plane 116 as shown in FIG. 1. In FIG. 6, V$_1$<0 and V$_2$=−V$_1$>0, thus a horizontal electric field is induced between plates 110 and 112 which deflects the electron beam 258 to the right as shown. Virtual rays 256 are extrapolated upwards (above the effective blanking plane 116) from rays 258—the apparent source of rays 256 determines the position of the virtual object 255. Beam 258 represents a partially-blanked beam in the column since fewer electrons pass through aperture 120 in beam 258 than in beam 218 in FIG. 5. Those electrons that do pass through aperture 120 form diverging beam 262, which is focused into converging beam 266 by lens 224. Beam 266 is focused onto the surface of substrate 128 at image 269 by lens 224. The beam at image 269 is a focused image of the virtual object 255. Because crossover 254 is not in the effective blanking plane 116, the virtual object 255 for lens 224 appears to be offset to the left, as shown. For lens 224, the offset of virtual object 255 means that the image 269 on substrate 128 is offset to the right, as is familiar to those skilled in the art. Because image 269 is no longer on axis 103, there is non-conjugate blanking and the pattern written on substrate 128 will be blurred.

Non-Conjugate Blanking—Crossover Below the Effective Blanking Plane

FIGS. 7 and 8 illustrate the opposite case from FIGS. 5 and 6: the crossover is now below the effective blanking plane 116, corresponding to a situation in which the magnification of the source at the substrate is larger than in FIGS. 3 and 4.

FIG. 7 is a schematic side cross-sectional view of a prior art electron beam column showing an unblanked beam with a crossover 314 below the center of a single pair of blanker plates 110 and 112. Electrons are shown being emitted from a source tip 102 at the top of the column to form a diverging beam 304. Beam 304 is focused into a converging beam 308 by lens 306. Lens 306 is physically equivalent to lens 106 in FIGS. 3 and 4, however the focusing strength of lens 306 has been decreased relative to lens 106 to move crossover 314 lower than crossovers 114 and 154 in FIGS. 3 and 4, respectively. Since the position of the effective blanking plane 116 is unchanged, crossover 314 (in plane 317) is now no longer at the position required to produce conjugate blanking. In FIG. 7, $V_1=V_2=0$ (i.e., the blanker is not activated), thus there is no electric field induced between plates 110 and 112 and beam 308 above crossover 314, and beam 318 below crossover 314, are not deflected off axis 103. Because the diverging beam 318 is undeflected by the blanker, a portion of the electrons in beam 318 passes through aperture 120, to form diverging beam 322. Beam 322 is then focused into a converging beam 326 by lens 324. Lens 324 is physically equivalent to lens 124 in FIGS. 3 and 4, however the focusing strength of lens 324 has been increased relative to lens 124 to compensate for the lower position of crossover 314, which is the virtual object for lens 324. Beam 326 is focused onto the surface of substrate 128 at image 329 by lens 324. Because in FIG. 7 the blanker comprising plates 110 and 112 is not activated, image 329 still falls on axis 103.

FIG. 8 is a schematic side cross-sectional view of a prior art electron beam column showing a partially blanked beam with a crossover below the center of a single pair of blanker plates. As in FIG. 7, Electrons from source 102 form a diverging beam 304 which is focused into a converging beam 308 by lens 306. Lens 306 forms a crossover 354 in plane 117, which is below the effective blanking plane 116, as in FIG. 7. In FIG. 8, $V_1<0$ and $V_2=-V_1>0$, thus a horizontal electric field is induced between plates 110 and 112 which deflects the electron beam 357 to the right as shown. Beam 308 above the effective blanking plane 116 is a converging beam which can be treated as having a step-function deflection at the effective blanking plane 116 as shown in FIG. 1. Note that in this example, the beam crossover 354 is off-axis to the right in plane 317, in contrast with the situation for the virtual crossover 255 in FIG. 6. Beam 358 represents a partially-blanked beam in the column since fewer electrons in beam 358 pass through aperture 120 than in beam 318 in FIG. 7. Those electrons that do pass through aperture 120 form diverging beam 362, which is focused into converging beam 366 by lens 324. Beam 366 is focused onto the surface of substrate 128 at image 369 by lens 324. The beam at image 369 is a focused image of the beam crossover 354. For lens 324, the offset to the right of crossover 354 means that the image 369 on substrate 128 is offset to the left, as is familiar to those skilled in the art. Because image 369 is no longer on axis 103, there is non-conjugate blanking and the pattern written on substrate 128 will be blurred, as in FIG. 6.

In conclusion, there is a need for a method and apparatus for conjugate blanking of charged particle beams, which accommodates charged particle systems where there is no beam cross-over or the cross-over moves axially due to changes in lens excitations.

SUMMARY OF THE INVENTION

The present invention is a double-deflection beam blanker for use in a charged particle beam column and a method for using said beam blanker. The double deflection beam blanker comprises two deflectors, positioned one above the other along the optical axis of the column, and a blanking aperture positioned below the deflectors on the optical axis. The deflectors may be electrostatic or magnetic, and in preferred embodiments the deflectors are parallel plate electrostatic deflectors. The beam blanker of the present invention enables conjugate blanking even when the position of the blanking crossover is moved up and down on the column optical axis. Since the column magnification between the source and image on a substrate is controlled by the position of the beam crossover, a blanker enabling conjugate blanking for multiple crossover positions also enables charged particle beam column operation with multiple magnifications.

The invention provides methods of conjugate blanking of a charged particle beam within a charged particle column using a beam blanker. The beam blanker comprises a first deflector, a second deflector and a blanking aperture, the first deflector being positioned between a gun lens and a main lens, the second deflector being positioned between the first deflector and the main lens, the blanking aperture being positioned between the second deflector and the main lens, and the first deflector, the second deflector and the blanking aperture being aligned on the optical axis of the column.

A first method according to the invention comprises the steps of: configuring the column such that no charged particle beam cross-over is formed in the beam blanker; configuring the main lens to form an image of a virtual source of the charged particle beam at a substrate plane; deflecting the beam with a first deflector in a first direction; and deflecting the beam with a second deflector in a second direction onto the blanking aperture, wherein the first direction is antiparallel to the second direction; and wherein the image at the substrate plane does not move during blanking. This blanking is conjugate blanking.

A second method according to the invention comprises the steps of: configuring the gun lens to form a cross-over in the charged particle beam between the gun lens and the main lens; configuring the main lens to form an image at a substrate plane of the cross-over in the charged particle beam; deflecting the beam with a first deflector in a first direction; and deflecting the beam with a second deflector in a second direction onto the blanking aperture, wherein the first direction is parallel or antiparallel to the second direction; and wherein the image at the substrate plane does not move during blanking. This blanking is conjugate blanking.

Further to the above methods, the deflectors may be either electrostatic or magnetic electron-optical elements. Electrostatic deflectors may be parallel plate deflectors or more complex electron-optical elements, such as quadrupoles, octupoles, etc. Furthermore, the above methods may also include the step of executing a set-up routine for determining excitations of the first and second deflectors required to provide conjugate blanking of the charged particle beam, the routine comprising:

(a) applying a time varying signal to the deflectors in addition to the deflector excitations, wherein the signal is not so large as to cause the beam to be blanked;

(b) monitoring the image at the substrate plane;

(c) adjusting deflector excitations;

(d) monitoring the image at the substrate plane;

(e) repeating steps (c) and (d) until movement of the image at the substrate plane is measured to be below a preset level.

The deflector excitations will be voltages for electrostatic deflectors and currents for magnetic deflectors. This set-up routine requires neither knowledge of the existence of a cross-over nor the position of a cross-over.

BRIEF DESCRIPTION OF THE DRAWINGS

FIG. 3 is a schematic side cross-sectional view of a prior art electron beam column showing an unblanked beam with a crossover at the center of a single pair of blanker plates.

FIG. 4 is a schematic side cross-sectional view of a prior art electron beam column showing a partially blanked beam with a crossover at the center of a single pair of blanker plates.

FIG. 5 is a schematic side cross-sectional view of a prior art electron beam column showing an unblanked beam with a crossover above the center of a single pair of blanker plates.

FIG. 6 is a schematic side cross-sectional view of a prior art electron beam column showing a partially blanked beam with a crossover above the center of a single pair of blanker plates.

FIG. 7 is a schematic side cross-sectional view of a prior art electron beam column showing an unblanked beam with a crossover below the center of a single pair of blanker plates.

FIG. 8 is a schematic side cross-sectional view of a prior art electron beam column showing a partially blanked beam with a crossover below the center of a single pair of blanker plates.

FIG. 9 is a schematic side cross-sectional view of an electron beam column embodying the present invention, showing an unblanked beam with a crossover between the mid-planes of two pairs of blanker plates.

FIG. 10A is a schematic side cross-sectional view of an electron beam column embodying the present invention, showing a partially blanked beam with a crossover between the mid-planes of two pairs of blanker plates.

FIG. 13 is a schematic side cross-sectional view of an electron beam column embodying the present invention, showing an unblanked beam with a crossover below the mid-plane of a lower pair of blanker plates.

FIG. 14 is a schematic side cross-sectional view of an electron beam column embodying the present invention, showing a partially blanked beam with a crossover below the mid-plane of a lower pair of blanker plates.

FIG. 15 is a schematic side cross-sectional view of an electron beam column embodying the present invention, showing an unblanked beam with no crossover in the column.

FIG. 16 is a schematic side cross-sectional view of an electron beam column embodying the present invention, showing a partially blanked beam with no crossover in the column.

DETAILED DESCRIPTION

The present invention is a variable-ratio double-deflection (VRDD) beam blanker for use in a charged particle beam column comprising two deflectors, positioned one above the other along the optical axis, and a blanking aperture positioned below the deflectors on the optical axis. The voltages applied to the two deflectors are independently controllable in order to move the effective blanking plane to the position of the beam crossover (whether real or virtual), thereby enabling conjugate blanking.

Several Cases are Possible:

1) No Crossover Within the Column—in this case, the virtual object for the main lens is the virtual crossover formed by the focusing effects of the gun lens. The first deflector deflects the beam off-axis, while the second deflector deflects the beam in the antiparallel direction (i.e., back towards the axis). One example would be when the gun lens forms a parallel beam—in this case the virtual object is at minus infinity. If the gun lens forms a diverging beam, then the virtual object is above the actual charged particle source, while if the gun lens forms a converging beam, the virtual object will be below the substrate. This case is illustrated in FIGS. 15-16.

Figures 11, 12:
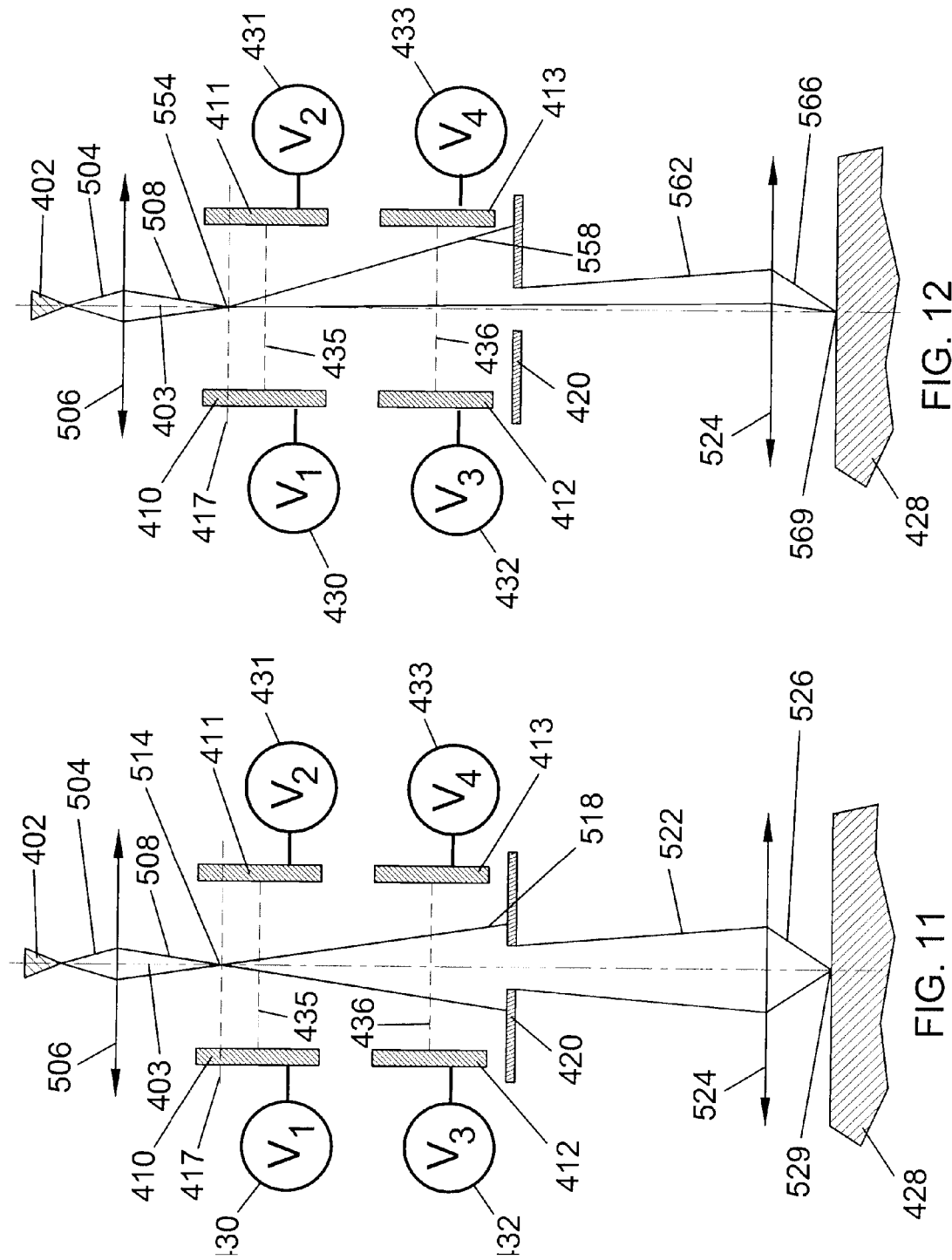
FIG. 11 is a schematic side cross-sectional view of an electron beam column embodying the present invention, showing an unblanked beam with a crossover above the mid-plane of an upper pair of blanker plates.
FIG. 12 is a schematic side cross-sectional view of an electron beam column embodying the present invention, showing a partially blanked beam with a crossover above the mid-plane of an upper pair of blanker plates.

2) Intermediate Crossover Above the Mid-Plane of the Upper Pair of Blanker Plates—in this case, the first deflector deflects the beam off-axis, while the second deflector deflects the beam in the antiparallel direction (i.e., back towards the axis). The combination of these two deflections results in the beam appearing to originate from the position of the intermediate crossover, but with the beam heading off-axis towards the blanking aperture. This case is illustrated in FIGS. 11-12.

Figure 10B:
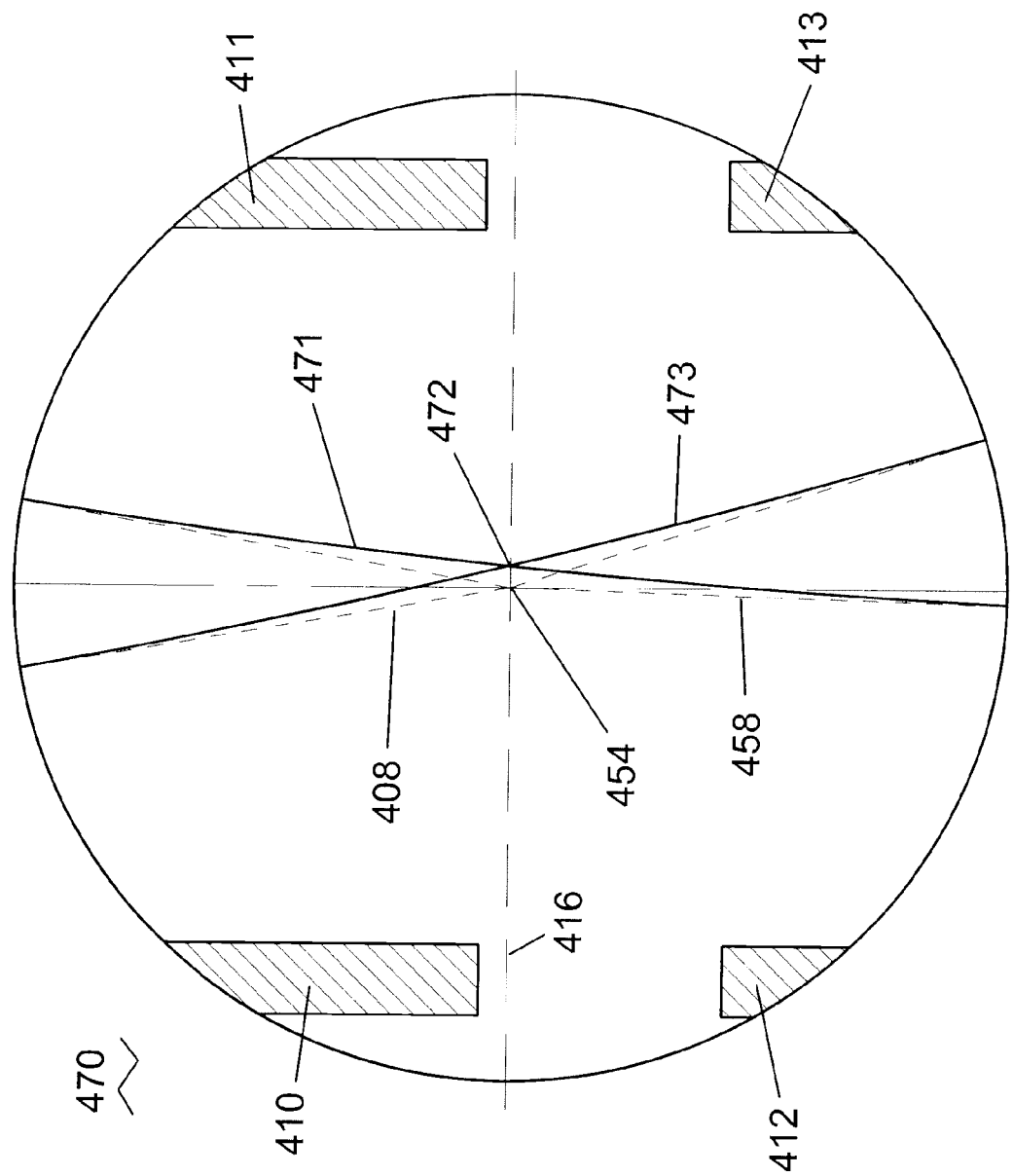
FIG. 10B is a close-up side cross-sectional view of the beam crossover in FIG. 10A.

3) Intermediate Crossover Between Mid-planes of the First and Second Pairs of Blanker Plates—in this case, both plates deflect the beam in the same off-axis direction (i.e., the first and second beam deflections are parallel). Again, the apparent origin of the beam after deflection by the deflectors is the actual position of the intermediate crossover. Because the beam has an angle relative to the axis, it strikes the blanking aperture. This case is illustrated in FIGS. 9-10B.

4) Intermediate Crossover Below the Mid-Plane of the Lower Pair of Blanker Plates—in this case, the first deflector deflects the beam off-axis, while the second deflector deflects the beam in the antiparallel direction (i.e., back towards the axis). The combination of these two deflections results in the beam heading back towards the axis so that it intersects the axis at the intermediate crossover. Because the beam has an angle relative to the axis, it strikes the blanking aperture. This case is illustrated in FIGS. 13-14.

The required position of the crossover is assumed to be predetermined by the need to produce a beam at the substrate of a specified size, thus the crossover height cannot be varied to achieve conjugate blanking. However, conjugate blanking can be achieved in the present invention by varying the relative strengths of the two deflectors—pairs of blankers (410 and 411) and (412 and 413)—where at all times $V_1 = -V_2$ and $V_3 = -V_4$. See FIGS. 9-14. Since the column magnification between the source and image on a substrate is controlled by the position of the beam crossover, a blanker enabling conjugate blanking for multiple crossover positions also enables charged particle column operation with multiple magnifications.

If the beam crossover is above the mid-plane of the upper pair of blanker plates 410 and 411 (see FIGS. 11-12), then it is necessary to set $V_1$ to the opposite polarity from $V_3$. With the proper choice of the ratio of $V_1$ to $V_3$, it is possible to achieve conjugate blanking without any actual crossover, instead utilizing the virtual source as a virtual crossover (see FIGS. 15-16). Some examples of this special case of variable-ratio double-deflection beam blanking are also described in U.S. patent application Ser. No. 10/962,049 filed Oct. 7, 2004, and U.S. patent application Ser. No. 11/225,376 filed Sep. 12, 2005, both incorporated by reference herein. If the beam crossover is below the mid-plane of the lower pair of blanker plates 412 and 413 (see FIGS. 13-14), then it is also necessary to set $V_1$ to the opposite polarity from $V_3$. If the beam crossover is between the mid-plane of the upper pair of blanker plates 410 and 411 and the mid-plane of the lower pair of blanker plates 412 and 413 (see FIGS. 9-10B), then $V_1$ and $V_3$ will have the same polarity. If $V_1$ and $V_3$ have the same polarity, the beam deflection due to the second pair of blanker plates 412 and 413 deflects the beam in a direction parallel to the deflection due to the first pair of blanker plates 410 and 411. If $V_1$ and $V_3$ have opposite polarity, the beam deflection due to the second pair of blanker plates 412 and 413 deflects the beam in a direction antiparallel to the deflection due to the first pair of blanker plates 410 and 411.

The beam blanker of the present invention may be used in a variety of charged particle beam columns. The charged particles may be electrons or ions. An example of a charged particle beam column with beam blanking is an electron beam lithography column.

Figure 17:
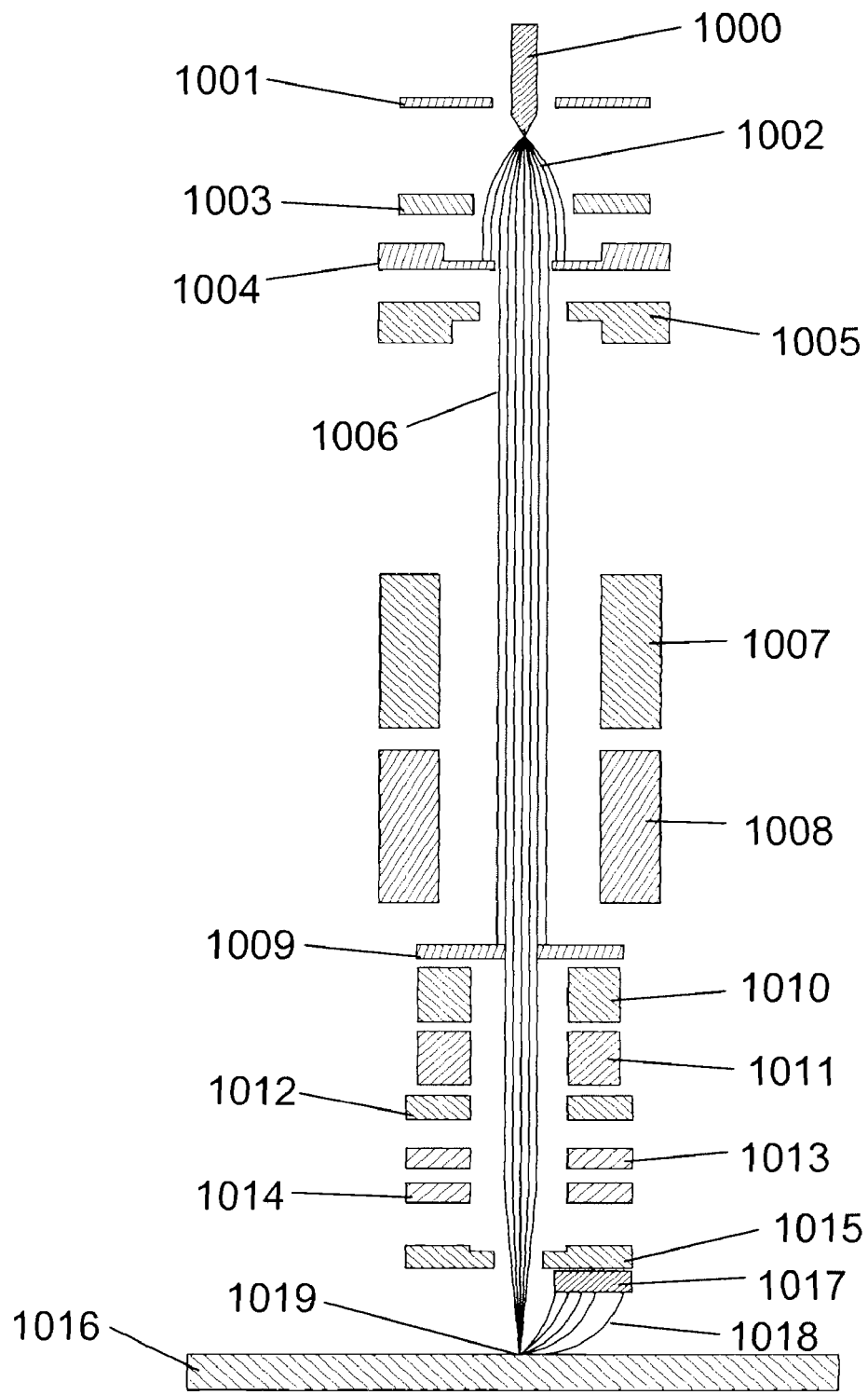
FIG. 17 is a side cross-sectional view of an electron beam column embodying the variable-ratio double-deflection blanker of the present invention.

FIG. 17 is a schematic side cross-sectional view of an electron beam column showing the variable-ratio double-deflection beam blanker of the present invention. Electrons 1002 are emitted from a source tip 1000 at the top of the column due to an electric field induced at the source tip 1000 by an applied voltage difference between source tip 1000 and extractor 1003. Suppressor 1001 reduces undesirable electron emission from the shank of source tip 1000. Electrodes 1003-1005 form a "gun" lens which, in this example, is shown focusing the electrons 1002 from source tip 1000 into an approximately parallel beam 1006. The electron source can be a cold field emitter, a Schottky thermal field emitter, a $LaB_6$ thermal emitter, a thermionic source, or any other type of electron emitter—the particular type of electron source is not part of the present invention. For the present invention, beam 1006 need not be approximately parallel as shown here—beam 1006 may be either diverging or converging. If beam 1006 is diverging, a virtual crossover is formed above the source tip 1000. If beam 1006 is converging, depending on the magnitude of the convergence angle, there may be a real crossover above the main lens formed by electrodes 1012-1014 or there may be a virtual crossover below the substrate 1016. Beam 1006 enters the variable-ratio double-deflection blanker comprised of two deflectors (shown here as pairs of blanker plates), an upper deflector 1007 and a lower deflector 1008. After passing between deflectors 1007 and 1008, beam 1006 is apertured at the blanking aperture 1009. In the case of a blanked beam, transverse electric fields on deflectors 1007 and 1008 would deflect beam 1004 off-axis onto blanking aperture 1009, thereby preventing beam 1006 from reaching the substrate 1016 (see FIGS. 10A, 12, 14, and 16).

If beam 1006 is not blanked, beam 1006 passes through blanking aperture 1009 and into the lower column, comprising mainfield deflectors 1010 and 1011, subfield deflector 1012, and the main lens, consisting of electrodes 1013-1015. Beam 1006 is focused by the main lens onto the substrate 1016 at location 1019. Due to the impact of beam 1006, emission of secondary and backscattered electrons is induced. Electron detector 1017 collects a fraction of the total number of secondary and backscattered electrons 1018, to form an imaging signal. Note that the position of the top surface of the substrate is referred to herein as the substrate plane. The substrate plane is the plane onto which the beam 1006 is focused, as described above.

Variable-Ratio Double-Deflection Blanking with the Beam Crossover Between the Mid-Planes of the Upper and Lower Pairs of Blanking Plates FIG. 9 is a schematic side cross-sectional view of an electron beam column embodying the present invention, showing an unblanked beam with a crossover 414 between the mid-planes 435 and 436 of two pairs of blanker plates. Electrons are shown being emitted from source tip 402 at the top of the column to form a diverging beam 404. Beam 404 is focused into a converging beam 408 by lens 406. Source 402, lens 406, blanking aperture 420, and lens 424 are all centered on symmetry axis 403. Lens 406 forms a crossover 414 on axis 403 at the effective blanking plane 416 of the VRDD blanker comprising two pairs of blanker plates: a first pair of plates 410 and 411 (with mid-plane 435), and a second pair of plates 412 and 413 (with mid-plane 436)—note that the effective blanking plane 416 is between the two mid-planes 435 and 436. Plates 410-413 extend above and below the planes of FIGS. 9-14B. The voltages on each of plates 410-413 can be independently controlled by power supplies $V_1$ 430, $V_2$ 431, $V_3$ 432, and $V_4$ 433, respectively. In general, $V_1=-V_2$ and $V_3=-V_4$. However, in the present invention, there is no requirement for $V_1=V_3$, and, in some cases, $V_1$ may have the opposite polarity from $V_3$. In FIG. 9, $V_1=V_2=0$, thus there is no electric field induced between plates 410 and 411. Similarly, $V_3=V_4=0$, thus there is no electric field induced between plates 412 and 413. Because there are no transverse fields in the VRDD blanker, beam 408 above crossover 414, and beam 418 below crossover 414, are not deflected off axis 403. Since the diverging beam 418 is undeflected by the VRDD blanker, a portion of the electrons in beam 418 passes through aperture 420, to form diverging beam 422. Beam 422 is then focused into a converging beam 426 by lens 424. Beam 426 is focused onto the surface of substrate 428 at image 429 by lens 424. The overall magnification of the electron source 402 at the substrate 428 is determined by the position of crossover 414 in relation to source 402, lenses 406 and 424, and substrate 428, as is familiar to those skilled in the art.

Figure 1:
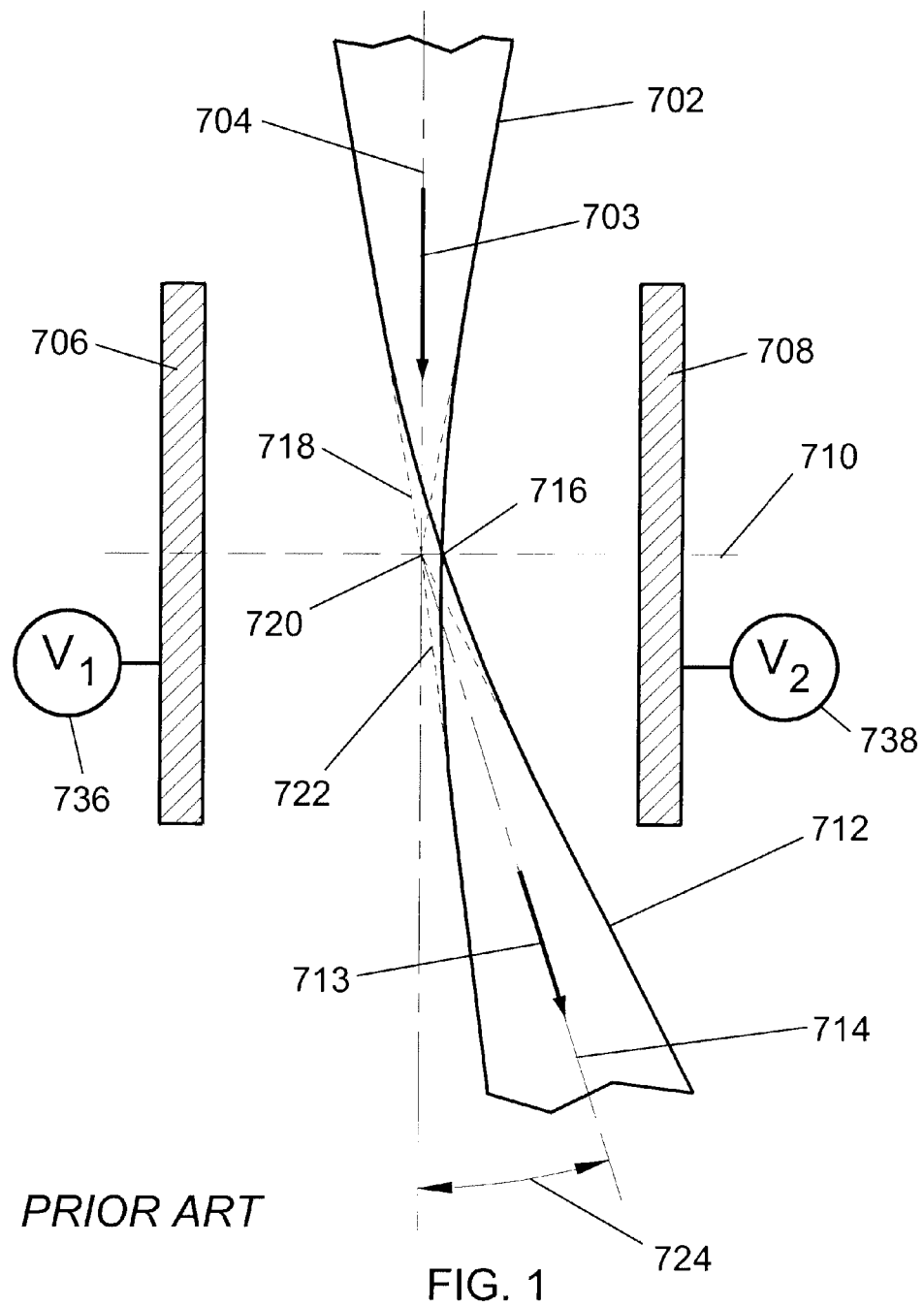
FIG. 1 is a schematic side cross-sectional view of a first prior art beam blanker deflecting a charged particle beam.
Figure 2:
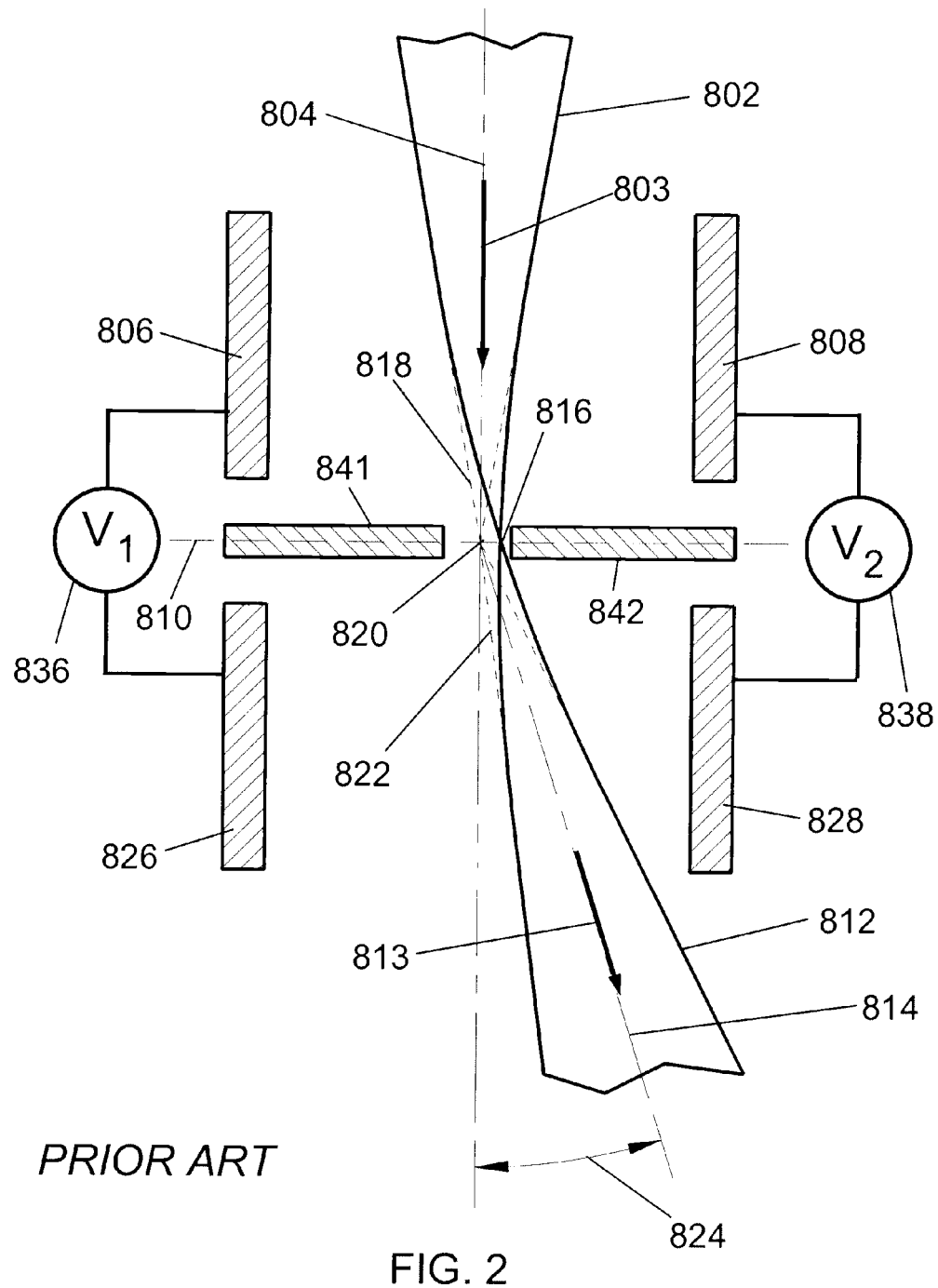
FIG. 2 is a schematic side cross-sectional view of a second prior art beam blanker deflecting a charged particle beam.

FIG. 10A is a schematic side cross-sectional view of an electron beam column embodying the present invention, showing a partially blanked beam with a crossover 454 between the mid-planes 435 and 436 of two pairs of blanker plates. As in FIG. 9, electrons from source 402 form a diverging beam 404 which is focused into a converging beam 408 by lens 406. Lens 406 forms a crossover 454 on axis 403 at the effective blanking plane 416. In FIG. 10, $V_1<0$ and $V_2=-V_1>0$, thus a horizontal electric field is induced between plates 410 and 411. Similarly, $V_3<0$ and $V_4=-V_3>0$, thus a horizontal electric field is induced between plates 412 and 413. The horizontal electric fields between plates 410 and 411 and between plates 412 and 413 combine to deflect the electron beam 458 to the right as shown. In FIG. 10A, $|V_1|>|V_3|$, because crossover 454 is above the midpoint on axis 403 between the mid-planes 435 and 436 of the upper and lower pairs of blanking plates, respectively. In the special case where crossover 454 falls exactly at the midpoint on axis 403 between mid-planes 435 and 436, then $|V_1|=|V_3|$. For the case where the crossover 454 falls below the midpoint on axis 403 between mid-planes 435 and 436, $|V_1|<|V_3|$. Note that the approximation of a step-function beam deflection illustrated in FIG. 1 is used here—the curvature of the actual electron trajectories while passing between the blanker plates 410-413 is not shown in FIG. 10A.

Referring to FIG. 10A, in order to illustrate conjugate blanking, beam 458 is shown as a partially-blanked beam. Those electrons that do pass through aperture 420 form diverging beam 462, which is focused into converging beam 466 by lens 424. Beam 466 is focused onto the surface of substrate 428 at image 469 by lens 424. The beam at image 469 is a focused image of the virtual object at the beam crossover 454. Because the beam effectively "pivots" at the crossover 454, the image at image 469 is on axis 403 giving conjugate blanking. In other words, during beam blanking, as the beam 458 is being moved onto the blanking aperture 420, the part of the beam that passes through the blanking aperture will remain focused on the same point 469 on the substrate and will not move.

FIG. 10B is a close-up side cross-sectional view 470 of the beam crossover region in FIG. 10A. Here the rays 408 and 458 corresponding to the approximation of a step-function beam deflection are shown as dashed lines. The actual curved trajectories 471 and 473 are shown as solid lines. Trajectories 471 above the effective blanking plane 416 converge to crossover 472. Trajectories 473 below the effective blanking plane 416 diverge away from crossover 472.

In order to ensure conjugate blanking in the column illustrated in FIGS. 9 and 10A, it is clearly necessary to maintain the beam crossovers 414 and 454 at the effective blanking plane 416 as was the case for crossovers 114 and 154 in FIGS. 3 and 4. However, in the present invention, FIGS. 11-14B illustrate that it is possible to move the effective blanking plane 416 along the axis 403 in a controllable manner in order to position the effective blanking plane 416 at the position of the beam crossover, thereby allowing the beam crossover to be moved up and down the axis 403 in order to adjust the magnification of the column while preserving conjugate blanking.

Variable-Ratio Double-Deflection Blanking with the Beam Crossover Above the Mid-Plane of the Upper Pair of Blanking Plates FIG. 11 is a schematic side cross-sectional view of an electron beam column embodying the present invention, showing an unblanked beam with a crossover 514 above the mid-plane 435 of the upper pair of blanker plates 410 and 411. Electrons are shown being emitted from source tip 402 at the top of the column to form a diverging beam 504. Beam 504 is focused into a converging beam 508 by lens 506. Lens 506 is physically equivalent to lens 406 in FIGS. 9 and 10, however the focusing strength of lens 506 has been increased relative to lens 406 to move crossover 514 higher in the column (along axis 403) than crossovers 414 and 454 in FIGS. 9 and 10, respectively. Lens 506 forms crossover 514 on axis 403 at the effective blanking plane 417 of the VRDD blanker, above the mid-plane 435 of the upper pair of blanking plates. In FIG. 11, $V_1=V_2=0$, thus there is no electric field induced between plates 410 and 411. Similarly, $V_3=V_4=0$, thus there is no electric field induced between plates 412 and 413. Because there are no transverse fields in the VRDD blanker, beam 508 above crossover 514, and beam 518 below crossover 514, are not deflected off axis 403. Since the diverging beam 518 is undeflected by the VRDD blanker, a portion of the electrons in beam 518 passes through aperture 420, to form diverging beam 522. Beam 522 is then focused into converging beam 526 by lens 524. Lens 524 is physically equivalent to lens 424 in FIGS. 9 and 10, however the focusing strength of lens 524 has been decreased relative to lens 424 to compensate for the higher position of crossover 514, which is the virtual object for lens 524. Beam 526 is focused onto the surface of substrate 428 at image 529 by lens 524. FIG. 11 corresponds to the case in which the magnification of the source at the substrate is smaller than in FIGS. 9 and 10. Because in FIG. 11 the blanker comprising plates 410-413 is not activated, image 529 still falls on axis 403.

FIG. 12 is a schematic side cross-sectional view of an electron beam column embodying the present invention, showing a partially blanked beam with a crossover 554 above the mid-plane 435 of the upper pair of blanker plates 410 and 411. As in FIG. 11, electrons from source 402 form a diverging beam 504 which is focused into a converging beam 508 by lens 506. Lens 506 forms a crossover 554 in the effective blanking plane 417, as in FIG. 11. Beam 558 below crossover 554 is a diverging beam which can be treated as having a step-function deflection at the effective blanking plane 417 as shown in FIG. 1. In FIG. 12, $V_1<0$ and $V_2=-V_1>0$, thus an electric field is induced between plates 410 and 411. In contrast, $V_3>0$ and $V_4=-V_3<0$, thus there is an electric field induced between plates 412 and 413 with the opposite polarity from the electric field between plates 410 and 411. The electric field between plates 410 and 411 deflects the electron beam 558 to the right and the electric field between plates 412 and 413 deflects the beam back to the left. In all cases with a real crossover above the mid-plane 435 of the upper pair of blanking plates, $|V_1|=|V_2|>|V_3|=|V_4|$, making the magnitude of the deflection due to the upper pair of blanking plates 410 and 411 greater than the magnitude of the deflection (in the opposite direction) due to the lower pair of blanking plates 412 and 413.

Referring to FIG. 12, in order to illustrate conjugate blanking, beam 558 is shown as a partially-blanked beam. Those electrons that do pass through aperture 420 form a diverging beam 562, which is focused into converging beam 566 by lens 524. Beam 566 is focused onto the surface of substrate 428 at image 569 by lens 524. The beam at image 569 is a focused image of the crossover 554. Because crossover 554 is on-axis 403 in the effective blanking plane 417, the virtual object for lens 524 appears to be on axis 403, thus image 569 is also on axis 403, giving conjugate blanking. In other words, during beam blanking, as the beam 558 is being moved onto the blanking aperture 420, the part of the beam that passes through the blanking aperture will remain focused on the same point 569 and will not move.

Variable-Ratio Double-Deflection Blanking with the Beam Crossover Below the Mid-Plane of the Lower Pair of Blanking Plates FIGS. 13 and 14 illustrate the opposite case from FIGS. 11 and 12: the effective blanking plane 617 has been moved below the position of the effective blanking plate 416 in FIGS. 9-10B. This corresponds to a situation in which the magnification of the source at the substrate is larger than in FIGS. 9-10B.

FIG. 13 is a schematic side cross-sectional view of an electron beam column embodying the present invention, showing an unblanked beam with a crossover 614 below the mid-plane 436 of the lower pair of blanker plates 412 and 413. Electrons are shown being emitted from source tip 402 at the top of the column to form a diverging beam 604. Beam 604 is focused into a converging beam 608 by lens 606. Lens 606 is physically equivalent to lens 406 in FIGS. 9 and 10, however the focusing strength of lens 606 has been decreased relative to lens 406 to move crossover 614 lower in the column (along axis 403) than crossovers 414 and 454 in FIGS. 9 and 10, respectively. Lens 606 forms crossover 614 on axis 403 at the effective blanking plane 617 of the VRDD blanker, below the mid-plane 436 of the lower pair of blanking plates. In FIG. 13, $V_1=V_2=0$, thus there is no electric field induced between plates 410 and 411. Similarly, $V_3=V_4=0$, thus there is no electric field induced between plates 412 and 413. Because there are no transverse fields in the VRDD blanker, beam 608 above crossover 614, and beam 618 below crossover 614, are not deflected off axis 403. Since the diverging beam 618 is undeflected by the blanker, a portion of the electrons in beam 618 passes through aperture 420, to form diverging beam 622. Beam 622 is then focused into a converging beam 626 by lens 624. Lens 624 is physically equivalent to lens 424 in FIGS. 9 and 10, however the focusing strength of lens 624 has been increased relative to lens 424 to compensate for the lower position of crossover 614, which is the virtual object for lens 624. Beam 626 is focused onto the surface of substrate 428 at image 629 by lens 624. FIG. 13 corresponds to the case in which the magnification of the source at the substrate is larger than in FIGS. 9 and 10. Because in FIG. 13 the blanker comprising plates 410-413 is not activated, image 629 still falls on axis 403.

FIG. 14 is a schematic side cross-sectional view of an electron beam column embodying the present invention, showing a partially blanked beam with a crossover 654 below the mid-plane 436 of the lower pair of blanker plates 412 and 413. As in FIG. 13, electrons from source 402 form a diverging beam 604 which is focused into a converging beam 608 by lens 606. Lens 606 forms a crossover 654 in the effective blanking plane 617, as in FIG. 13. Beam 658 below crossover 654 is a diverging beam which can be treated as having a step-function deflection at the effective blanking plane 617 as shown in FIG. 1. In FIG. 14, $V_1>0$ and $V_2=-V_1<0$, thus an electric field is induced between plates 410 and 411. In contrast, $V_3<0$ and $V_4=-V_3>0$, thus there is an electric field induced between plates 412 and 413 with the opposite polarity from the electric field induced between plates 410 and 411. The electric field between plates 410 and 411 deflects the electron beam 658 to the left and the electric field between plates 412 and 413 deflects the beam back to the right. In all cases with a real crossover below the mid-plane 436 of the lower pair of blanking plates, $|V_1|=|V_2|<|V_3|=|V_4|$, making the magnitude of the deflection due to the upper pair of blanking plates 410 and 411 smaller than the magnitude of the deflection (in the opposite direction) due to the lower pair of blanking plates 412 and 413.

Referring to FIG. 14, in order to illustrate conjugate blanking, beam 658 is shown as a partially-blanked beam. Those electrons that do pass through aperture 420 form diverging beam 662, which is focused into converging beam 666 by lens 624. Beam 666 is focused onto the surface of substrate 428 at image 669 by lens 624. The beam at image 669 is a focused image of the crossover 654. Because crossover 654 is on axis 403 in the effective blanking plane 617, the virtual object for lens 624 appears to be on axis 403, thus image 669 is also on axis 403, giving conjugate blanking. In other words, during beam blanking, as the beam 658 is being moved onto the blanking aperture 420, the part of the beam that passes through the blanking aperture will remain focused on the same point 669 and will not move.

Variable-Ratio Double-Deflection Blanking with No Crossover in the Column

FIG. 15 is a schematic side cross-sectional view of an electron beam column embodying the present invention, showing an unblanked beam with no crossover in the column. Electrons are shown being emitted from source tip 402 at the top of the column to form a diverging beam 904. Beam 904 is focused into a converging beam 908 by lens 906. Lens 906 is physically equivalent to lens 406 in FIGS. 9 and 10, however the focusing strength of lens 906 has been decreased relative to lens 406 to make beam 908 roughly parallel such that there is no crossover within the column, i.e., between tip 402 and substrate 428. In this example, the effective beam crossover (and thus also the effective blanking plane) is not shown in FIG. 15 because it is either above tip 402 (for the case of a slightly diverging beam 908) or below substrate 428 (for the case of a slightly converging beam 908). For the special case of a parallel beam 908, the virtual beam crossover (and effective blanking plane) is at $-\infty$ (or, equivalently, $+\infty$), as is familiar to those skilled in the art. In FIG. 15, $V_1=V_2=0$, thus there is no electric field induced between plates 410 and 411. Similarly, $V_3=V_4=0$, thus there is no electric field induced between plates 412 and 413. Because there are no transverse fields in the VRDD blanker, beam 908 is not deflected off axis 403. Since beam 908 is undeflected by the blanker, a portion of the electrons in beam 908 passes through aperture 420, to form beam 922. Beam 922 is then focused into a converging beam 926 by lens 924. Lens 924 is physically equivalent to lens 424 in FIG. 9, however the focusing strength of lens 924 has been decreased relative to lens 424 to compensate for the fact that the virtual crossover (which is the virtual object for lens 924) is effectively higher than the real crossover 414 in FIG. 9. Beam 926 is focused onto the surface of substrate 428 at image 929 by lens 924. Because in FIG. 15 the blanker comprising plates 410-413 is not activated, image 929 still falls on axis 403.

FIG. 16 is a schematic side cross-sectional view of an electron beam column embodying the present invention, showing a partially blanked beam with no crossover in the column. As in FIG. 15, electrons from source 402 form a diverging beam 904 which is focused into a converging beam 908 by lens 906. In FIG. 16, $V_1<0$ and $V_2=-V_1>0$, thus an electric field is induced between plates 410 and 411. In contrast, $V_3>0$ and $V_4=-V_3<0$, thus there is an electric field induced between plates 412 and 413 with the opposite polarity from the electric field induced between plates 410 and 411. The electric field between plates 410 and 411 deflects the electron beam 954 to the right and the electric field between plates 412 and 413 deflects the beam 958 back to the left.

Referring to FIG. 16, in order to illustrate conjugate blanking, beam 958 is shown as a partially-blanked beam. Those electrons that do pass through aperture 420 form beam 962, which is focused into converging beam 966 by lens 624. Beam 666 is focused onto the surface of substrate 428 at image 669 by lens 924. The beam at image 969 is a focused image of the virtual crossover (not shown). Because the virtual crossover is on axis 403 in the effective blanking plane (not shown), the virtual object for lens 924 appears to be on axis 403, thus image 969 is also on axis 403, giving conjugate blanking. In other words, during beam blanking, as the beam 958 is being moved onto the blanking aperture 420, the part of the beam that passes through the blanking aperture will remain focused on the same point 969 and will not move.

Method for Setting up the Blanker Plate Voltages

FIGS. 9-16 illustrate ideal beam setups, where the voltages on the upper and lower blanker plates have been adjusted to position the effective blanking planes at the heights of the beam crossovers (real or virtual). This section discusses how to accomplish these ideal set ups. The solution is provided by analogy with FIGS. 3-8. The examples shown in FIGS. 5-8 show that if the beam crossover is not at the effective blanking plane, then there will not be conjugate blanking. If a time-varying voltage (smaller in magnitude than the blanking voltage) is applied to the blanker plates 410-413, the beam will be swept left and right (i.e., the virtual object for the main lens will move off-axis left and right), but the beam will still be transmitted through the blanking aperture 420. This "wobbling" method is similar to the standard technique of applying a time-varying voltage to an electrostatic lens electrode (or a time-varying current to the coil in a magnetic lens) in order to align a beam with a lens optical axis. If the effective blanking plane is not at the crossover, then the relative strengths of the voltages applied to the two pairs of blanker electrodes must be changed in order to eliminate any motion of the focused beam at the substrate plane. Note that the beam may be simultaneously raster-scanned by some deflection means (such as mainfield deflectors 1010 and 1011, or subfield deflectors 1012—see FIG. 17) during this set-up routine, in which case movement of the focused beam on the surface of a substrate may conveniently be monitored using an electron detector 1017 (see FIG. 17). The electron detector 1017 forms an image of the surface of the substrate 1016, and movement of the focused beam 1019 during this image formation is readily detectable provided the frame rate for the image is much greater than the frequency of the "wobbling" signal.

An example of a set-up routine is as follows:
(a) apply a time varying signal to the blanking plates in addition to the blanking voltage, wherein the signal is not so large as to cause the beam to be blanked;
(b) monitor the position of the focused beam at the substrate plane;
(c) adjust the blanking plate voltages;
(d) monitor the position of the focused beam at the substrate plane;
(e) repeat steps (c) and (d) until movement of the focused beam at the substrate plane is measured to be below a preset level.

The preset level is determined by the positional requirements for the lithographic writing beam, for example, as defined by the International Technical Roadmap for Semiconductors.

The method for setting up voltages (or currents) for deflector configurations other than parallel plates (see below) is analogous to the method described above.

Avoidance of Beam Motion During Blanking and Unblanking

Further to the above discussion, the dynamic nature of the blanking voltages is considered. When the beam is unblanked, all blanker plates are set to 0 V, in order to avoid generating any horizontal (transverse) electric fields. As the beam goes from an unblanked to a blanked condition, the voltages on the blanking plates should ramp up or down from 0 V simultaneously, preserving the necessary voltage ratios to preserve conjugate blanking during the blanking and unblanking processes. The electronics required for ramping the voltages as described above, is well known to those skilled in the art.

Alternative Embodiments

Although the above discussion has explained the operation of the present invention in terms of blanking electron beams, the invention is also capable of blanking other types of charged particle beams, such as positive or negative ion beams.

In the descriptions of electrostatic blankers, pairs of parallel plates were described. It is also possible to implement some or all of the electrostatic blanker elements using arrays of electrodes with circular symmetry centered around the column optical axis, such as quadrupoles, hexapoles, octupoles, or 2N-poles where N is an integer >4. In these cases, voltages may be applied to the various electrodes to generate transverse electric fields with high degrees of spatial uniformity, thereby reducing aberrations induced in the beam during the blanking and unblanking processes. An example of such a non parallel plate blanker structure is provided in U.S. application Ser. No. 11/225,376, filed Sep. 12, 2005, incorporated by reference herein.

In addition, although in the above descriptions of the blankers they are described as electrostatic blankers, the present invention may be implemented utilizing magnetic blankers. In this case, each blanker element could consist of a pair of North/South poles with parallel pole faces positioned symmetrically on each side of the column optical axis. It is also possible to implement some or all of the magnetic blanker elements using arrays of pole pieces with circular symmetry centered around the column optical axis, such as quadrupoles, hexapoles, octupoles, or 2N-poles where N is an integer >4. In these cases, excitations may be applied to the various pole faces using exciting coils to generate transverse magnetic fields with high degrees of spatial uniformity, thereby reducing aberrations induced in the beam during the blanking and unblanking processes.

Either magnetic or electrostatic lenses may be used in the column optics. Should the charged particle beam be exposed to a magnetic field, due to magnetic optical elements in the column, as it passes through the beam blanker, the charged particle beam will be rotated about the electron-optical axis as it passes through the blanker, as is well known to those skilled in the art. Under such conditions, the requirement that the deflections of the first and second deflectors be parallel or antiparallel is understood to require that the deflections be parallel or antiparallel after accounting for the beam rotation due to the magnetic field. In other words, if the beam blanker is immersed in a magnetic field which causes the charged particle beam to rotate by 2 degrees between the midpoint of the first deflector and the midpoint of the second deflector and there is no cross-over in the column, then the direction of the deflection of the first deflector and the direction of deflection of the second deflector will be required to be in planes at an angle of 180−2=178 degrees to each other in order to achieve conjugate blanking according to the present invention, wherein the planes contain the optical axis and the directions of deflection.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A method of blanking a charged particle beam within a charged particle column using a beam blanker, said beam blanker comprising a first deflector, a second deflector and a blanking aperture, said first deflector being positioned between a gun lens and a main lens, said second deflector being positioned between said first deflector and said main lens, said blanking aperture being positioned between said second deflector and said main lens, said first deflector, said second deflector and said blanking aperture being aligned on the optical axis of said column, said method comprising:
configuring said column such that no charged particle beam cross-over is formed in said column;
configuring said main lens to form an image of a virtual source of said charged particle beam at a substrate plane;
deflecting said beam with a first deflector in a first direction; and deflecting said beam with a second deflector in a second direction onto said blanking aperture, wherein said first direction is antiparallel to said second direction;

wherein said image at said substrate plane does not move during blanking.

2. A method as in claim 1, wherein said charged particle beam in said beam blanker is neither substantially convergent nor substantially divergent.

3. A method as in claim 1, wherein said first deflector and said second deflector are electrostatic deflectors.

4. A method as in claim 3, wherein said first deflector and said second deflector are parallel plate electrostatic deflectors.

5. A method as in claim 1, further comprising executing a set-up routine for determining excitations of said first and second deflectors required to provide conjugate blanking of said charged particle beam, said routine comprising:
 (a) applying a time varying signal to said deflectors in addition to said deflector excitations, wherein said signal is not so large as to cause said beam to be blanked;
 (b) monitoring said image at said substrate plane;
 (c) adjusting deflector excitations;
 (d) monitoring said image at said substrate plane;
 (e) repeating steps (c) and (d) until movement of said image at said substrate plane is measured to be below a preset level.

6. A method as in claim 5, wherein said deflector excitations are voltages.

7. A method of blanking a charged particle beam within a charged particle column using a beam blanker, said beam blanker comprising a first deflector, a second deflector and a blanking aperture, said first deflector being positioned between a gun lens and a main lens, said second deflector being positioned between said first deflector and said main lens, said blanking aperture being positioned between said second deflector and said main lens, said first deflector, said second deflector and said blanking aperture being aligned on the optical axis of said column, said method comprising:
 configuring said gun lens to form a cross-over in said charged particle beam between said gun lens and said main lens;
 configuring said main lens to form an image at a substrate plane of said cross-over in said charged particle beam;
 deflecting said beam with a first deflector in a first direction; and
 deflecting said beam with a second deflector in a second direction onto said blanking aperture, wherein said first direction and said second direction lie along parallel lines;

wherein said image at said substrate plane does not move during blanking.

8. A method as in claim 7, wherein said first deflector and said second deflector are electrostatic deflectors.

9. A method as in claim 8, wherein said first deflector and said second deflector are parallel plate electrostatic deflectors.

10. A method as in claim 7, wherein said charged particle beam has a cross-over between said gun lens and the mid-plane of said first deflector, wherein said first deflection direction is antiparallel to said second deflection direction.

11. A method as in claim 7, wherein said charged particle beam has a cross-over between the mid-plane of said first deflector and the mid-plane of said second deflector, wherein said first deflection direction is parallel to said second deflection direction.

12. A method as in claim 7, wherein said charged particle beam has a cross-over between the mid-plane of said second deflector and said main lens, wherein said first deflection direction is antiparallel to said second deflection direction.

13. A method as in claim 7, further comprising executing a set-up routine for determining excitations of said first and second deflectors required to provide conjugate blanking of said charged particle beam, said routine comprising:
 (a) applying a time varying signal to said deflectors in addition to said deflector excitations, wherein said signal is not so large as to cause said beam to be blanked;
 (b) monitoring said image at said substrate plane;
 (c) adjusting deflector excitations;
 (d) monitoring said image at said substrate plane;
 (e) repeating steps (c) and (d) until movement of said image at said substrate plane is measured to be below a preset level.

14. A method as in claim 13, wherein said deflector excitations are voltages.

* * * * *